United States Patent
Miller

(10) Patent No.: US 7,653,102 B2
(45) Date of Patent: Jan. 26, 2010

(54) METHOD AND APPARATUS FOR CONTROLLING OUTPUT POWER LEVELS OF A LASER USED FOR OPTICAL DATA TRANSMISSION BASED ON DATA RATE-SPEED OPTICAL FEEDBACK

(75) Inventor: Frederick W. Miller, Santa Clara, CA (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/626,914

(22) Filed: Jan. 25, 2007

(65) Prior Publication Data

US 2008/0181272 A1     Jul. 31, 2008

(51) Int. Cl.
*H01S 3/00* (2006.01)
(52) U.S. Cl. .............. 372/38.07; 372/38.02; 372/38.01; 372/29.015; 372/29.011
(58) Field of Classification Search .............. 372/38.07, 372/38.02, 38.01, 38.1, 29.015, 29.011, 29.01
See application file for complete search history.

(56) References Cited

U.S. PATENT DOCUMENTS

2003/0103772 A1* 6/2003 Ishii et al. ................... 398/197

2005/0030985 A1* 2/2005 Diaz et al. ............. 372/29.015

\* cited by examiner

*Primary Examiner*—Minsun Harvey
*Assistant Examiner*—Kinam Park

(57) ABSTRACT

High-speed measurements of the output power level of a laser are obtained by using a high-speed laser output power monitoring device that is capable of producing an electrical feedback signal having an amplitude that varies as the output power level of the laser varies. A high-speed amplitude detector receives the electrical feedback signal and detects the amplitude of the feedback signal and produces an optical modulation amplitude (OMA) detection signal. The OMA detection signal is received in a high-speed amplitude measurement device that measures the OMA and produces an OMA measurement value. The OMA measurement value is then processed by the laser controller to obtain a modulation current control signal, which is then output to the laser driver to cause the laser driver to adjust the laser modulation current to obtain a desired or optimum laser output power level. An average amplitude measurement value may also be obtained using an average amplitude measurement device that processes the OMA detection signal produced by the high-speed amplitude detector to obtain the average amplitude measurement value. The laser controller receives the average amplitude measurement value and processes it to obtain a bias current control signal, which is then output to the laser driver to cause it to adjust the amplitude of the bias current to obtain a desired or optimum average laser output power level.

15 Claims, 4 Drawing Sheets

METHOD AND APPARATUS FOR CONTROLLING OUTPUT POWER LEVELS OF A LASER USED FOR OPTICAL DATA TRANSMISSION BASED ON DATA RATE-SPEED OPTICAL FEEDBACK

TECHNICAL FIELD OF THE INVENTION

The invention relates to lasers. More particularly, the invention relates to controlling laser output power levels based on optical feedback signals that are fed back at the same speed as the rate at which data is being transmitted.

BACKGROUND OF THE INVENTION

Lasers are used in many different industries for many different purposes, such as, for example, in the medical industry for medical procedures, in the printing industry in laser printers, in the defense industry in a variety of defense applications, and in the optical communications industry for transmitting and receiving optical signals. In many applications, the output power of the laser is monitored and controlled to maintain the output power at a desired or required level. Due to the wide variations in laser parameters such as, for example, laser slope efficiency (SE) and laser threshold current ($I_{TH}$), maintaining the optical power at a particular level is challenging because temperature and process variations and aging of system components also cause the output power level to vary. Many techniques and systems have been used or proposed to control and maintain the output power of the laser at required levels over temperature and process variations and time.

It is common practice in the optical communications industry to use a low-speed monitor photodiode to detect light output from a rear portion of the transmitter laser (or a portion of the output power reflected back through optical lenses) and to use this optical feedback to measure and control the average transmitted output power level of laser. In general, the average transmitted output power level, $P_{AVG}$, of the laser can be controlled by controlling the bias current, $I_{BIAS}$, of the laser. Thus, if the optical feedback indicates that $P_{AVG}$ has fallen below the required level, increasing $I_{BIAS}$ by an appropriate amount will raise $P_{AVG}$ to the required level. Similarly, if the optical feedback indicates that $P_{AVG}$ has risen above the required level, decreasing $I_{BIAS}$ by an appropriate amount will lower $P_{AVG}$ to the required level.

As the optical feedback path described above is used to maintain $P_{AVG}$ at the required level, the laser is modulated with a modulation current, $I_{MOD}$, to cause the laser output power level to be adjusted between an output power level, P1, that represents a logic 1, and an output power level, P0, that represents a logic 0. The amplitude of the modulation current $I_{MOD1}$ corresponds to an output power level of P1. The amplitude of the modulation current $I_{MOD0}$ corresponds to an output power level of P0. The laser threshold current $I_{TH}$ has an amplitude that is sufficient to cause the laser to begin producing laser action (i.e., to emit stimulated radiation). The amplitude of the threshold current $I_{TH}$ needed to produce laser action varies due to factors such as, for example, temperature and aging. Due to these variations in the amplitude of $I_{TH}$ that is needed to produce lasing and variations in the slope efficiency (SE) of the laser, periodic adjustments are typically made to the amplitudes corresponding to $I_{MOD1}$ and $I_{MOD0}$ in order to maintain P0 and P1 at the necessary respective output power levels.

A variety of techniques have been used to control the amplitude of the modulation current. One known technique sets the amplitude of the modulation current at a level that achieves a desired extinction ratio (ER) or optical modulation amplitude (OMA) at a fixed temperature or time. The amplitude of the modulation current is then increased or decreased based on an analog temperature coefficient, or in a digital control system, based on a temperature measurement and/or on an aging timer. This technique generally provides suitable results if the laser SE variation is controlled well enough to maintain the ER/OMA and the laser performance within specifications. A disadvantage of this technique is that using a single temperature reference point means the adjustment to the amplitude of the modulation current is essentially based on a "guess" of changes of the SE in direction and amount based on statistical or other data. Because the change in the SE often is not linear and can change from positive to negative slope from one temperature to the next, it is difficult or impossible to determine the optimal adjustment in the amplitude of the modulation current. In addition, this technique can also limit laser yields because the SE and $I_{TH}$ limits need to be within sufficiently tight tolerances to guarantee that a suitable level of performance will be achieved without the necessity of testing each laser over temperature and customizing each laser based on the results of testing.

Another known technique involves measuring the amplitudes of the modulation current needed to maintain the required output power levels $P_{AVG}$, P0 and P1 over a range of temperatures on a part-by-part or wafer-by-wafer basis. The amplitude values obtained during testing are programmed into a lookup table (LUT) memory element or other non-volatile memory element. A controller uses a temperature measurement value to index into the memory element and read out the corresponding amplitude value for the modulation current. The amplitude of the modulation current of the laser is then set to the value read out of the memory element. One disadvantage of this technique is that it requires over-temperature testing during manufacturing, which is very time consuming and expensive. In addition, it is difficult to factor in aging when using this technique, which means that the amplitude of the modulation current often will not be set to an optimal level.

Another known technique involves measuring $I_{TH}$ in situ by adjusting the modulation current amplitude while measuring the optical feedback signal produced by a low-bandwidth monitor photodiode and calculating the corresponding SE based on the low-speed feedback signal. The measured $I_{TH}$ and calculated SE are then used to calculate the amount of modulation current needed. An advantage of this technique is that the existing low-speed monitor photodiode feedback path is used. A disadvantage of this technique is that it requires a large amount of signal processing to be performed to make the necessary calculations, and is therefore computationally intensive. Another disadvantage is that the method is performed during module power up or module programming, and generally cannot be used while transmitting actual data.

A similar technique also uses the existing low-speed monitor photodiode feedback path to calculate SE, but also modulates a very small amplitude signal at low frequency on top of the $I_{BIAS}$ supplied to the laser. This low frequency signal is then extracted from the feedback signal, amplified and used to calculate SE. The calculated SE is then used to determine how to adjust the modulation current amplitude. This method can be used while transmitting actual data, but requires that high accuracy circuits such as amplifiers, analog-to-digital converters (ADCs) and digital-to-analog converters (DACs) be included in the feedback path. In addition, this technique also requires a significant amount of signal processing, and is therefore computationally intensive.

Another technique that has been proposed involves using a high-speed monitor diode in combination with an amplitude detector to monitor the output power level of the laser and adjust the amplitude of the modulation current to achieve the required output power level using an analog feedback loop. This technique requires an additional high-bandwidth feedback path for the amplitude detector, which makes obtaining stable operation extremely difficult. In addition, the performance of the amplitude detector can be significantly affected by temperature variations, which can lead to less than optimal performance. Also, the amplitude detector dissipates a large amount of power relative to the rest of the transmitter due to its high bandwidth and continuous operation. Because of these difficulties, this technique has been proposed, but not actually implemented. This technique and the present invention were commonly owned at the time of the present invention, and are currently owned, by the assignee of the present application, Avago Technologies, Inc.

It would be desirable to provide a way to monitor optical feedback at the rate at which the data is transmitted because it would enable direct measurements of the OMA and/or ER to be obtained, which then could be used to adjust the amplitudes of $I_{BIAS}$ and $I_{MOD}$ as needed to obtain the desired or optimum laser output power levels. As described above, using the low-speed feedback path provides data from which an inference can be made from as to how much to adjustment the amplitudes of $I_{BIAS}$ and $I_{MOD}$. Because this inference is made from low speed or DC measurements, it often does not result in adjustments being made to the amplitudes of $I_{MOD}$ and $I_{BIAS}$ that provide the optimum or desired level of performance. Providing the ability to successfully use high-speed optical feedback to obtain direct measurements of OMA and ER could also eliminate the need to use complex signal processing algorithms or to perform calculations based on age, temperature measurements or DC information that is not 100% correlated. Accordingly, a need exists for a way to use high-speed optical feedback to obtain direct measurements that can be used to adjust the amplitudes of $I_{BIAS}$ and/or $I_{MOD}$ to achieve the optimum or desired laser output power levels.

SUMMARY OF THE INVENTION

In accordance with the invention, high-speed measurements of the output power level of a laser are obtained by using a high-speed laser output power monitoring device that produces a high-speed electrical feedback signal. A high-speed amplitude detector receives the electrical feedback signal and detects the optical modulation amplitude (OMA) of the feedback signal and produces an OMA detection signal. The OMA detection signal is then received in a high-speed amplitude measurement device that measures the OMA and produces an OMA measurement value. The OMA measurement values is then processed by the laser controller to obtain a modulation current control signal, which is then output to the laser driver to cause the laser driver to adjust the laser modulation current to obtain a desired or optimum laser output power level.

An average amplitude measurement value may also be obtained using an average amplitude measurement device that processes the OMA detection signal produced by the high-speed amplitude detector to obtain the average amplitude measurement value. The laser controller receives the average amplitude measurement value and processes it to obtain a bias current control signal, which is then output to the laser driver to cause it to adjust the amplitude of the bias current to obtain a desired or optimum average laser output power level.

These and other features and advantages of the invention will become apparent from the following description, drawings and claims.

DETAILED DESCRIPTION OF AN ILLUSTRATIVE EMBODIMENT

Figure 1:
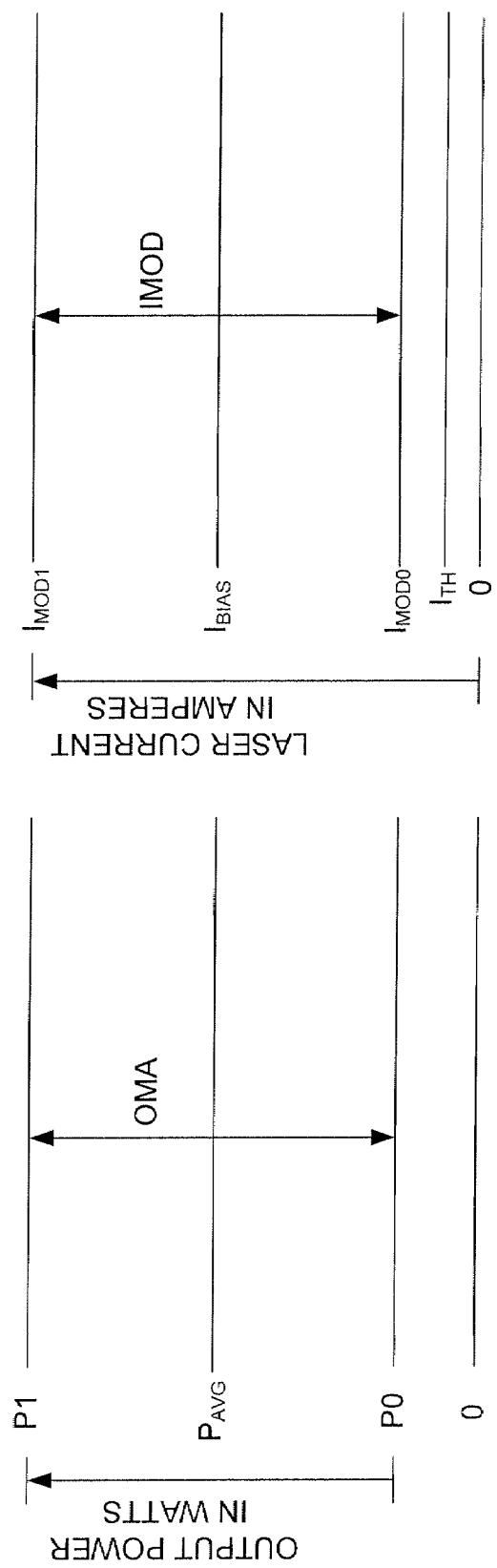
FIG. 1 is a graph illustrating the relationship between laser output power in watts and laser bias, threshold and modulation current in amperes.

FIG. 1 illustrates a graph that demonstrates the relationship between laser output power in watts and laser current (bias, threshold and modulation) in amperes. To cause the laser to produce an output power level of P0 for a logic 0 level, the laser is modulated with a modulation current, $I_{MOD0}$, that has an amplitude that is equal to or slightly greater than the amplitude of the laser threshold current, $I_{TH}$. If the amplitude of $I_{MOD0}$ falls below the amplitude of $I_{TH}$, the laser is being over-modulated due to the fact that the laser is being turned off and the level of P0 cannot fall below zero, so the amplitude of the modulation current for a logic 1 level, $I_{MOD1}$, must be increased in order to maintain $I_{BIAS}$ at a constant amplitude. Maintaining $I_{BIAS}$ at a constant amplitude generally results in the average output power level, $P_{AVG}$, being maintained at a constant level, except when the laser is being over-modulated. When the amplitude of $I_{MOD0}$ falls below the amplitude of $I_{TH}$, the laser turns completely off during the transmission of a logic 0 (output power level P0). When the laser turns off during the transmission of a logic 0, this slows down the transition back to a logic 1 (output power level P1), which degrades laser performance.

In accordance with the invention, direct high-speed measurements of the output power level of the laser are obtained by using a high-speed optical detector and the amplitude of laser modulation current, $I_{MOD}$, is adjusted based on the measurements to obtain a desired or optimum laser output power level. The modulation current, $I_{MOD}$, has an amplitude that is equal to the amplitude of $I_{MOD1}$ minus the amplitude of $I_{MOD0}$. The laser bias current $I_{BIAS}$ has an amplitude necessary to keep the average output power level $P_{AVG}$ at its desired average value. As is shown in FIG. 1, the amplitudes of $I_{BIAS}$, $I_{MOD0}$ and $I_{MOD1}$ correspond to the output power levels of $P_{AVG}$, P0 and P1, respectively. The difference between the P1 and P0 levels is the optical modulation amplitude (OMA) of the laser. The average output power level $P_{AVG}$ is the average OMA (i.e., the sum of P0 and P1 levels divided by two). The average output power level of the laser is measured through optical feedback and a running average over time is maintained. Although $P_{AVG}$ generally is controlled by setting the amplitude of the bias current $I_{BIAS}$, changes in the amplitude of $I_{MOD}$ result in changes to the OMA, and thus, in some conditions, result in changes to the $P_{AVG}$ level. Therefore, in accordance with the invention, both or either of the amplitudes of $I_{BIAS}$ and $I_{MOD}$ are adjusted as needed based on the high-speed measurements of the output power level to maintain $P_{AVG}$ at a reasonably constant level while also achieving a desired or optimum amplitude for $I_{MOD}$.

The power dissipation and stability of the high speed monitoring loop are mitigated by closing the loop digitally such that the loop bandwidth can be controlled at frequencies impractical for analog circuits. Because the laser parameters change at a very slow rate, the monitoring loop can be digitally controlled to operate at a very low duty cycle, which can make the overall power dissipation low, even though the power dissipation that results when the loop is enabled may be high. Digitally controlling the loop also allows simple calibration techniques (along with a temperature sensor) to be used to zero out temperature variations in the high-speed amplitude measurement circuits. In addition, process variations can be easily eliminated by using a simple calibration technique in manufacturing.

Figure 2:
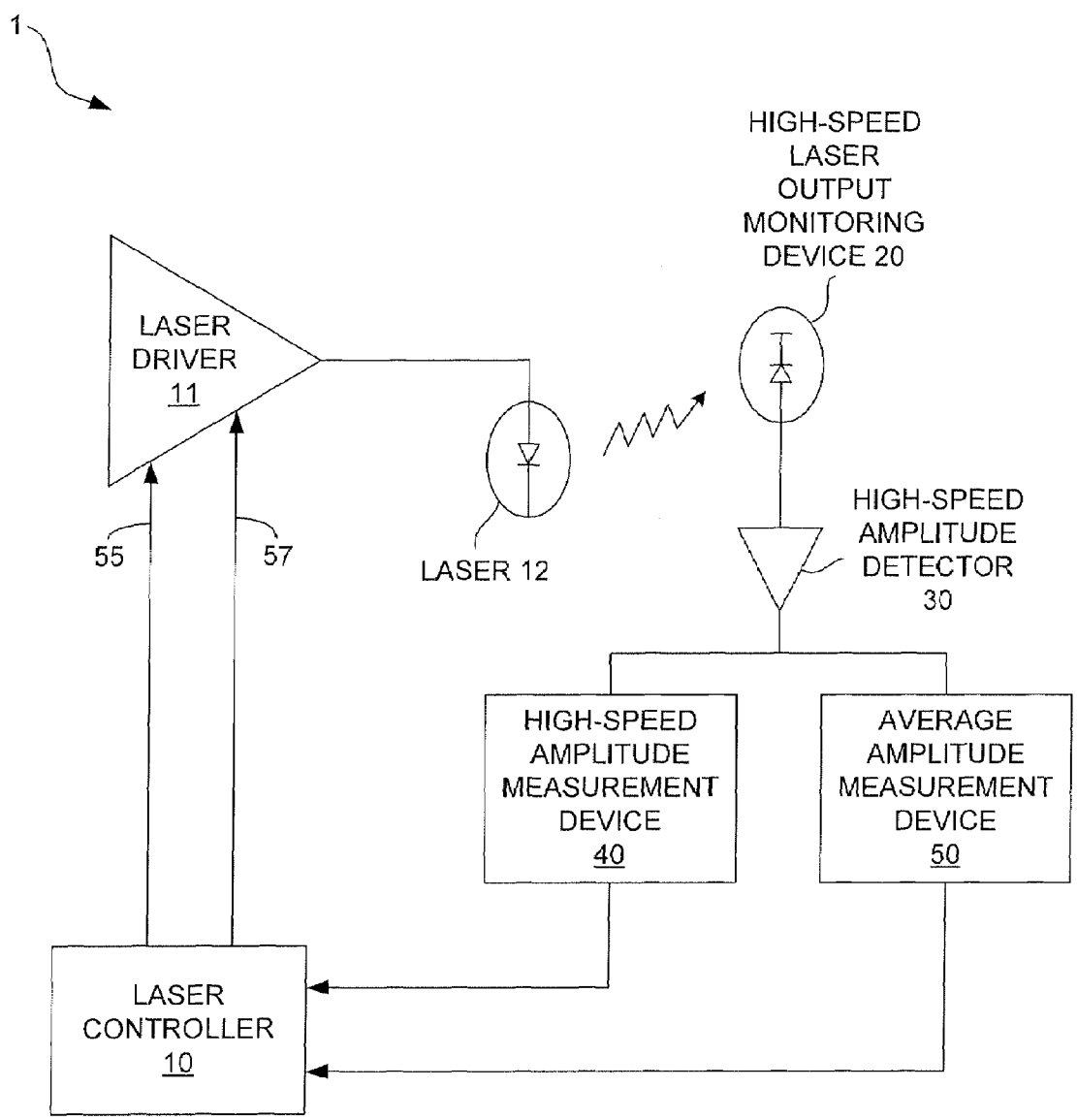
FIG. 2 illustrates a block diagram of the apparatus of the invention in accordance with an illustrative embodiment in which the invention is employed in an optical communications network of some type for transmitting amplitude modulated optical signals.

FIG. 2 illustrates a block diagram of the apparatus 1 of the invention in accordance with an illustrative embodiment. The apparatus 1 includes a laser controller 10, a laser driver 11, a laser 12, a high-speed laser output power monitoring device 20, a high-speed amplitude detector 30, a high-speed amplitude measurement device 40, and an average amplitude measurement device 50. The laser controller 10 and the laser driver 11 are typically separate integrated circuit (ICs) that are mounted to a transceiver housing (not shown) of an optical communications transceiver (not shown) and electrically connected with one another. The laser 12 is typically a laser diode, but may be any type of laser that is directly modulated. The high-speed laser output power monitoring device 20 is typically a high-bandwidth photodiode, but may be any type of device capable of monitoring the optical output power of the laser 12 and producing a signal having an amplitude that varies with variations in the laser output power level. The laser 12 and the monitoring device 20 are typically also implemented in separate ICs.

The high-speed amplitude detector 30 is typically a high-speed trans-impedance amplifier (TIA). The high-speed amplitude measurement device 40 is an analog amplitude measurement device, such as a peak detector, for example. The high-speed amplitude measurement device 40 receives the amplified high-speed signal output from the TIA 30 and produces an amplitude measurement value. The amplitude measurement value is typically a value corresponding to the OMA of the laser 12, but could be some other value (e.g., a value corresponding to P1 or P0). The amplitude measurement value is converted by an analog-to-digital converter (ADC) (not shown) into a digital amplitude value, which is received by the controller 10. The ADC may be part of the measurement device 40 or it may be a separate component interposed between the output of the measurement device 40 and the input to the controller 10. If the ADC is a high-speed ADC capable of operating at speeds greater than the data rate of the transmitter, the output of the high-speed amplitude measurement device 40 will not need to be lowpass filtered. If the ADC is not capable of operating at speeds greater than the data rate of the transmitter, the output of the high-speed amplitude measurement device 40 will typically be put through a lowpass filter device (not shown) before being input to the ADC for conversion from an analog voltage signal into a digital voltage signal. In the latter case, the lowpass filter may be part of the measurement device 40 or it may be a separate component interposed between the output of the measurement device 40 and the input to the controller 10.

The controller 10 receives the digital amplitude value and performs a modulation current adjustment algorithm that processes the digital amplitude value to determine, based on the value, whether the amplitude of the modulation current $I_{MOD}$ is to be adjusted. If the algorithm determines that an adjustment is to be made, the algorithm determines the magnitude and polarity of the adjustment and outputs a corresponding control signal to the laser driver 11. Signal line 55 represents the control signal output by the controller 10 to the laser driver 11 to cause the laser driver 11 to set the amplitude of $I_{MOD}$ to a particular value based on the results of the algorithm. The modulation current adjustment algorithm will be described below in detail with reference to FIG. 4.

The average amplitude measurement device 50 also receives the amplified high-speed signal output from the TIA 30. The average amplitude measurement device 50 is a low-bandwidth analog device of the type currently used in the aforementioned existing optical feedback circuits for measuring the average output power level of a laser. The average amplitude measurement device 50 includes or is preceded by a lowpass filter device (not shown) that lowpass filters the signal output from the high-speed TIA 30. The average amplitude measurement device 50 produces an average amplitude measurement value corresponding to the average output power level of the laser 12. This average amplitude measurement value is an analog value that is converted into a digital average amplitude measurement value by an ADC (not shown), which may be part of the measurement device 50 or separate from the measurement device 50. The digital average amplitude measurement value is then processed by the controller 10 in accordance with a bias current adjustment algorithm that determines, based on the value, whether and by how much the amplitude of the bias current $I_{BIAS}$ is to be adjusted to maintain the average output power level of the laser at an optimum or desired level (typically constant). Signal line 57 represents the control signal output by the controller 10 to the laser driver 11 to cause the laser driver 11 to set the amplitude of $I_{BIAS}$ to a particular value. The bias current adjustment algorithm will be described below in detail with reference to FIG. 3.

Figure 3:
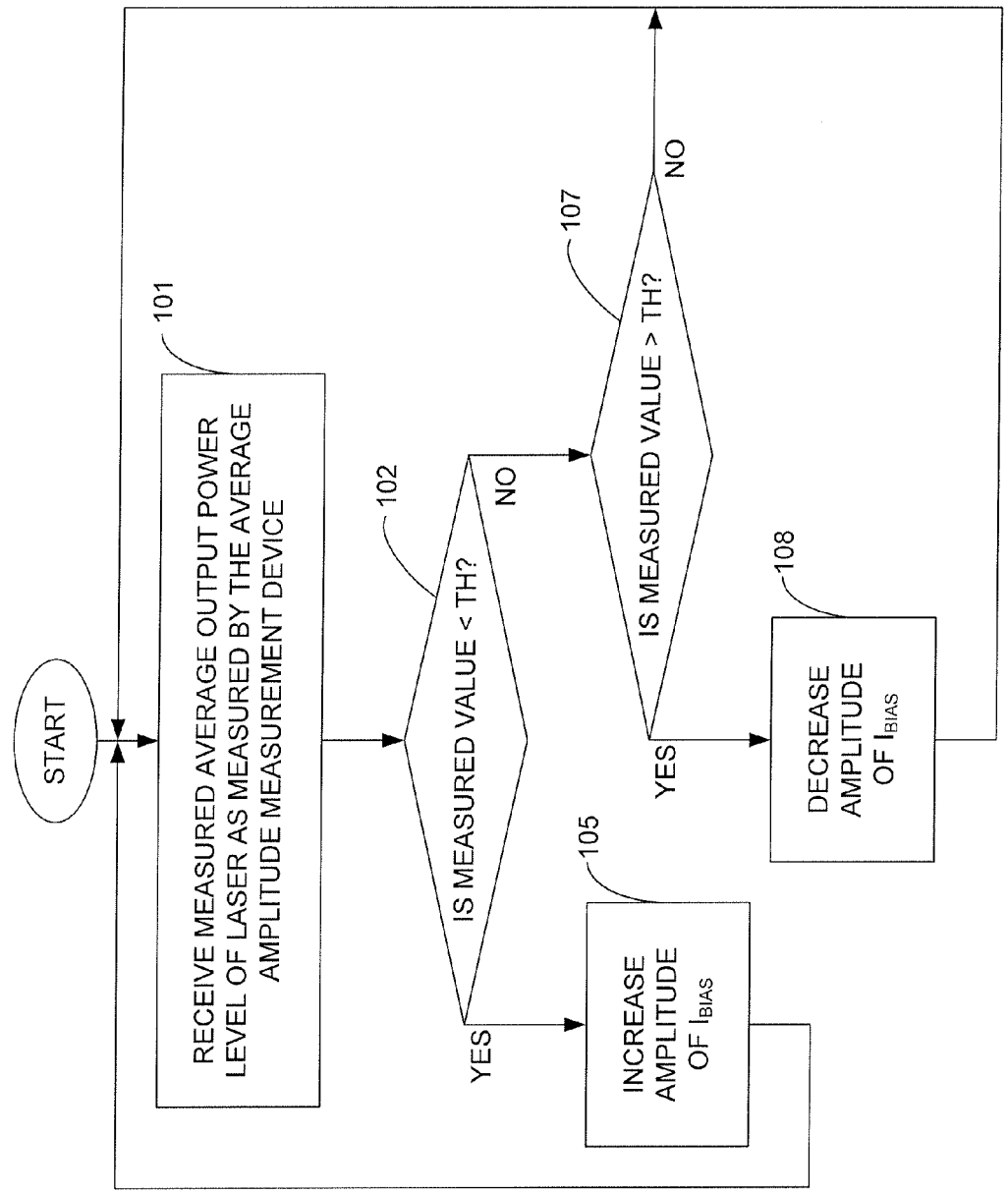
FIG. 3 illustrates a flowchart that demonstrates the method of the invention in accordance with an illustrative embodiment for controlling the laser bias current based on the output power level of the laser as detected by a high-speed amplitude detector.

FIG. 3 illustrates a flowchart that demonstrates the process performed by the bias current adjustment algorithm of the invention in accordance with an illustrative embodiment to control the laser bias current based on an average of the output power level of the laser as measured by the average amplitude measurement device 50. On power up, the controller 10 receives the average output power level as measured by the average amplitude measurement device 50 based on the output of the high-speed amplitude detector 30, as indicated by block 101. The controller 10 compares the value with a threshold value, TH, to determine whether the output power level is below a target average output power level, as indicated by block 102. If it is determined at block 102 that the measured amplitude value is less than TH, then the controller 10 sends a control signal to the laser driver 11 that causes the laser driver 11 to increase the amplitude of $I_{BIAS}$, as indicated by block 105. The algorithm then returns to block 101 and continues monitoring the average output power level of the laser.

If it is determined at block 102 that the measured amplitude value is not less than TH, then a determination is made as whether the measured value is greater than TH, as indicated by block 107. If not, the average output power level of the laser is at the target average output power level, and so the algorithm returns to block 101 and continues monitoring the average output power level of the laser. If it is determined at block 107 that the measured amplitude value is greater than TH, then the controller 10 sends a control signal to the laser driver 11 that causes the laser driver 11 to decrease the amplitude of $I_{BIAS}$, as indicated by block 108.

It is not necessary that the controller 10 continuously monitor the measured average amplitude. To save power, the controller 10 may disable the TIA 30 and the average amplitude measurement device 50 (and any other associated circuitry) after the process represented by FIG. 3 has been performed and then periodically enable these devices to perform the process. This could be accomplished by, for example, performing a delay routine after the process represented by block 107 has been performed and answered in the negative. Because temperature time constants are typically on the order of a second or longer, and because laser degradation due to aging happens at a very slow rate, it is not necessary for these components to be running continuously.

Figure 4:
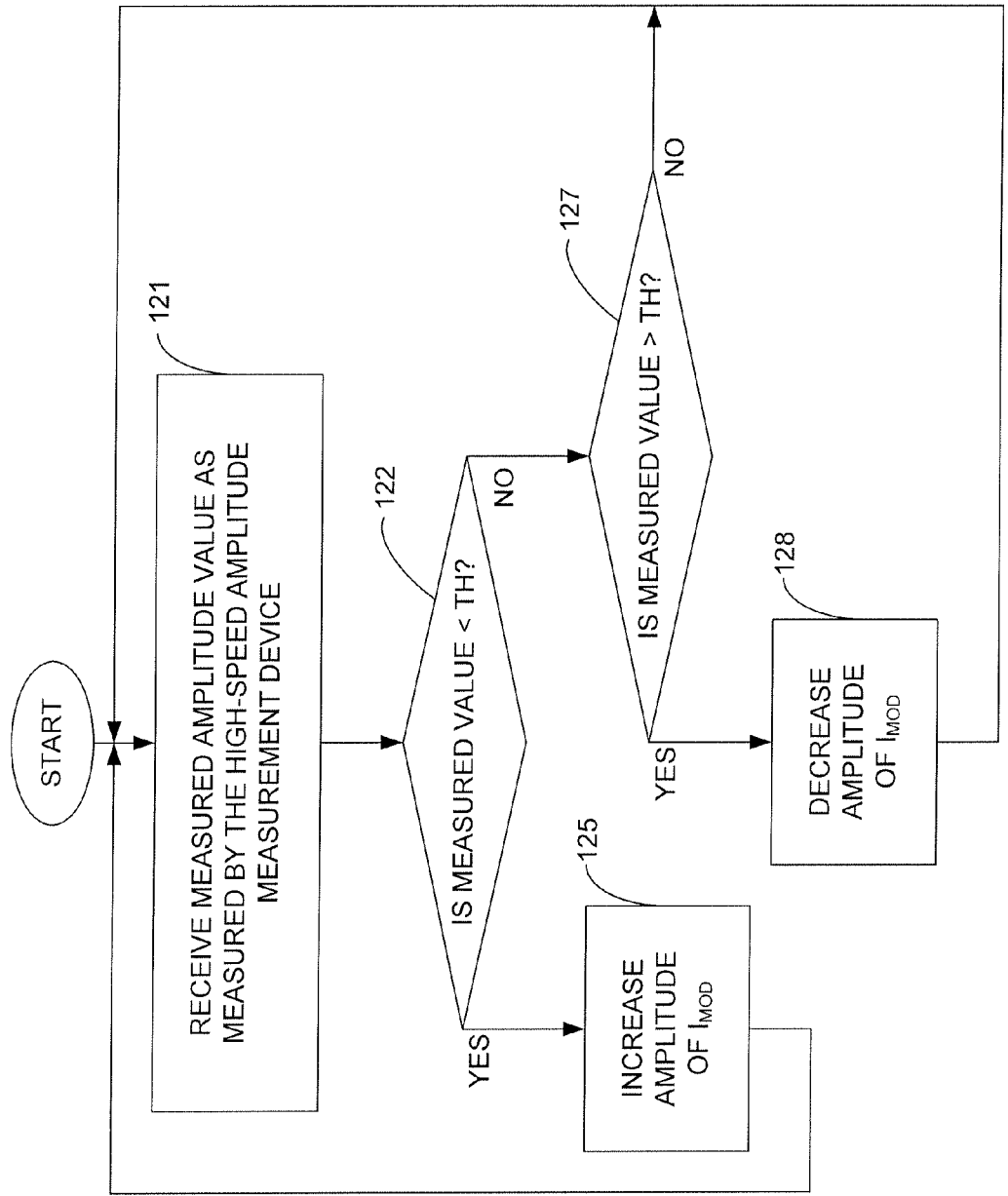
FIG. 4 illustrates a flowchart that demonstrates the method of the invention in accordance with an illustrative embodiment for controlling the laser modulation current based on the output power level of the laser as detected by a high-speed amplitude detector.

FIG. 4 illustrates a flowchart that demonstrates the process performed by the modulation current adjustment algorithm of the invention in accordance with an illustrative embodiment to control the laser modulation current based on the output power level of the laser as measured by a high-speed amplitude measurement device 40. This algorithm is typically performed after the bias current adjustment algorithm represented by the flowchart shown in FIG. 3 has determined that the average output power level of the laser is at the target average output power level. The controller 10 receives the OMA value corresponding to the modulated output power level of the laser as measured by the high-speed amplitude measurement device 40 based on the output of the high-speed amplitude detector 30, as indicated by block 121. The controller 10 compares the received OMA value with a target OMA value, TH, to determine whether the modulated output power level is below a target output power level, as indicated by block 122.

If it is determined at block 122 that the received OMA value is less than the corresponding target OMA value, then the controller 10 sends a control signal to the laser driver 11 that causes the laser driver 11 to increase the amplitude of $I_{MOD}$, as indicated by block 125. The algorithm then returns to block 121 and continues monitoring the output power level of the laser. If it is determined at block 122 that the measured OMA value is not less than the corresponding threshold value, then a determination is made as whether the received measured OMA value is greater than the corresponding threshold value, as indicated by block 127.

If the decision represented by block 127 is answered in the negative, this means that the modulation current does not need to be adjusted, and so the algorithm returns to block 121 and continues monitoring the output power level of the laser. If decision represented by block 127 is answered in the positive, then the controller 10 sends a control signal to the laser driver 11 that causes the laser driver 11 to decrease the amplitude of $I_{MOD}$, as indicated by block 128. The process then returns to block 121.

As stated above, adjusting the amplitude of $I_{MOD}$ can result in a variation in the $P_{AVG}$ level. For this reason, the controller 10 may periodically exit from the process represented by the flowchart shown in FIG. 4 and return to the process represented by the flowchart shown in FIG. 3. For example, after the decision represented by block 127 has been answered in the negative, the bias current adjustment algorithm represented by the flowchart shown in FIG. 3 may be performed to adjust the bias current as needed to ensure that the average output power level of the laser is at the target average output power level. In addition, it is not necessary that the controller 10 continuously monitor the measured amplitude value output from the high-speed amplitude measurement device 40. To save power, the controller 10 may disable the TIA 30 and the high-speed amplitude measurement device 40 (and any other associated circuitry) after the process represented by FIG. 4 has been performed and then periodically enable these devices to perform the process. This could be accomplished by, for example, performing a delay routine after the process represented by block 127 has been performed and answered in the negative.

The laser controller 10 may be any type of computational device capable of performing the processing tasks described above with reference to FIGS. 3 and 4 to generate the control signals 55 and 57. For example, the controller 10 may be a microprocessor, a microcontroller an application specific integrated circuit (ASIC), a programmable logic array (PLA), a programmable gate array (PGA), etc. The algorithms of the invention may be performed in hardware, software, firmware, or a combination thereof. If part or all of the algorithms are performed in software or firmware, the corresponding computer code will typically be stored in one or more computer-readable medium devices, which may be integrated together with the laser controller in a single IC or which may be implemented in a separate IC. The computer-readable medium need not be a solid state memory device, but may be any type of memory element that is suitable for the purpose for which it is used. Suitable memory devices include random access memory (RAM), read-only memory (ROM), programmable read-only memory (PROM), erasable PROM (EPROM), magnetic disks, magnetic tape, flash memory, etc. If all or a part of the algorithms are performed in hardware in the controller 10, the hardware may be implemented in the form of one or more state machines, for example.

It should be noted that the invention has been described with reference to a few illustrative embodiments for the purposes of demonstrating the principles and concepts of the invention and to provide a few examples of the manner in which the invention may be implemented. The invention is not limited to these embodiments, as will be understood by persons skilled in the art in view of the description provided herein. The invention also is not limited to being used in a communications transmitter, but may be used in any type of application including, for example, medical, industrial, printing, and defense applications. Those skilled in the art will understand that modifications may be made to the embodiments described herein and that all such modifications are within the scope of the invention.

What is claimed is:

1. An apparatus for controlling the output power level of a laser, the apparatus comprising:

a laser capable of being driven to produce light;

a laser driver that generates an electrical bias current signal and an electrical modulation current signal that are used to drive the laser to cause the laser to produce a modulated light beam that is modulated between a logic 0 output power level, P0, and a logic 1 output power level, P1;

a high-speed laser output power monitoring device that receives a fraction of the light produced by the laser as optical feedback and produces an electrical feedback signal based on the fraction of the light received from the laser, the electrical feedback signal having a first modulation amplitude corresponding to the laser output power level P0 and having a second modulation amplitude corresponding to the laser output power level P1;
a single high-speed amplitude detector that receives the electrical feedback signal produced by the monitoring device and detects the modulation amplitudes of the electrical feedback signal, the amplitude detector producing an optical modulation amplitude (OMA) detection signal corresponding to a difference between the first and second modulation amplitudes of the electrical feedback signal;
a high-speed amplitude measurement device that receives the OMA detection signal produced by the single high-speed amplitude detector and produces an OMA amplitude measurement value corresponding to the OMA detection signal;
an average amplitude measurement device that also receives the OMA detection signal produced by the single high-speed amplitude detector, the average amplitude measurement device producing an average amplitude measurement value based on the OMA detection signal; and
a laser controller that receives the OMA measurement values produced by the high-speed amplitude measurement device and performs a modulation current adjustment algorithm that processes the OMA measurement value and produces a modulation current control signal that is output to the laser driver, and wherein the laser driver receives the modulation current control signal produced by the laser controller and sets an amplitude of the electrical modulation current signal based on the received modulation current control signal, and wherein the laser controller also performs a bias current adjustment algorithm that processes the average amplitude measurement value and produces a bias current control signal that is output to the laser driver, and wherein the laser driver receives the bias current control signal and sets an amplitude of the electrical bias current signal based on the received bias current control signal.

2. The apparatus of claim 1, wherein when the controller processes the OMA measurement value, the controller compares the OMA measurement values to a threshold value to determine whether the compared value is less than the threshold value, wherein if the controller determines that the compared value is less than the threshold value, the modulation current control signal produced by the controller and output to the laser driver causes the laser driver to increase the amplitude of the electrical modulation current signal.

3. The apparatus of claim 2, wherein when the controller processes the OMA measurement value, the controller compares the OMA measurement value to a threshold value to determine whether the compared value is greater than the threshold value, wherein if the controller determines that the compared value is greater than the threshold value, the modulation current control signal produced by the controller and output to the laser driver causes the laser driver to decrease the amplitude of the electrical modulation current signal.

4. The apparatus of claim 1, wherein when the controller processes the average amplitude measurement value, the controller compares the average amplitude measurement value to a threshold value to determine whether the compared value is less than the threshold value, wherein if the controller determines that the compared value is less than the threshold value, the bias current control signal produced by the controller and output to the laser driver causes the laser driver to increase the amplitude of the electrical bias current signal.

5. The apparatus of claim 4, wherein when the controller processes the average amplitude measurement value, the controller compares the average amplitude measurement value to a threshold value to determine whether the compared value is greater than the threshold value, wherein if the controller determines that the compared value is greater than the threshold value, the bias current control signal produced by the controller and output to the laser driver causes the laser driver to decrease the amplitude of the electrical bias current signal.

6. A method for controlling the output power level of a laser, the method comprising:
in a laser driver, generating an electrical bias current signal and an electrical modulation current signal that are used to drive a laser to cause the laser to produce a modulated light beam that is modulated between a logic 0 output power level, P0, and a logic 1 output power level, P1;
receiving a fraction of the light produced by the laser as optical feedback in a high-speed laser output power monitoring device;
in the monitoring device, producing an electrical feedback signal based on the fraction of the light received from the laser, the electrical feedback signal having a first modulation amplitude when the laser output power level is P0 and having a second modulation amplitude when the laser output power level is P1; receiving the electrical feedback signal produced by the monitoring device in a single high-speed amplitude detector that detects the first and second modulation amplitudes of the electrical feedback signal;
in the single high-speed amplitude detector, producing an optical modulation amplitude (OMA) detection signal corresponding to a difference between the first and second modulation amplitudes of the electrical feedback signal;
receiving the OMA detection signal produced by the single high-speed amplitude detector in a high-speed amplitude measurement device;
receiving the OMA detection signal produced by the single high-speed amplitude detector in an average amplitude measurement device;
in the high-speed amplitude measurement device, producing an OMA measurement value corresponding to the OMA detection signal;
in the average amplitude measurement device, producing an average amplitude measurement value based on an average amplitude of the electrical feedback signal;
receiving the OMA measurement value output from the high-speed amplitude measurement device in a laser controller;
in the laser controller, performing a modulation current adjustment algorithm that processes the OMA measurement value and produces a modulation current control signal that is output to the laser driver, and wherein the laser driver receives the modulation current control signal and sets an amplitude of the electrical modulation current signal based on the received modulation current control signal; and
in the laser controller, performing a bias current adjustment algorithm that processes the average amplitude measurement value and produces a bias current control signal that is output to the laser driver, and wherein the laser driver receives the bias current control signal and sets an amplitude of the electrical bias current signal based on the received bias current control signal.

7. The method of claim 6, wherein when the controller processes the OMA measurement value, the controller compares the OMA measurement value to a threshold value to determine whether the compared value is less than the threshold value, wherein if the controller determines that the compared value is less than the threshold value, the modulation current control signal produced by the controller and output to the laser driver causes the laser driver to increase the amplitude of the electrical modulation current signal.

8. The method of claim 7, wherein when the controller processes the OMA measurement value, the controller compares the OMA measurement value to a threshold value to determine whether the compared value is greater than the threshold value, wherein if the controller determines that the compared value is greater than the threshold value, the modulation current control signal produced by the controller and output to the laser driver causes the laser driver to decrease the amplitude of the electrical modulation current signal.

9. The method of claim 6, wherein when the controller processes the average amplitude measurement value, the controller compares the average amplitude measurement value to a threshold value to determine whether the compared value is less than the threshold value, wherein if the controller determines that the compared value is less than the threshold value, the bias current control signal produced by the controller and output to the laser driver causes the laser driver to increase the amplitude of the electrical bias current signal.

10. The method of claim 9, wherein when the controller processes the average amplitude measurement value, the controller compares the average amplitude measurement value to a threshold value to determine whether the compared value is greater than the threshold value, wherein if the controller determines that the compared value is greater than the threshold value, the bias current control signal produced by the controller and output to the laser driver causes the laser driver to decrease the amplitude of the electrical bias current signal.

11. A computer program for controlling the output power level of a laser, the program comprising computer instructions for execution by a laser controller, the instructions being stored on a computer-readable medium, the program comprising:
   instructions for receiving an optical modulation amplitude (OMA) measurement value in a laser controller, the OMA measurement value being produced by a high-speed amplitude measurement device in response to the measurement device receiving an OMA detection signal from a single high-speed amplitude detector, the high-speed amplitude detector producing the OMA detection signal based on first and second modulation amplitudes of an electrical feedback signal received from a high-speed laser output power monitoring device, the first modulation amplitude of the electrical feedback signal corresponding to a first laser output power level, P1, the second modulation amplitude of the electrical feedback signal corresponding to a second laser output power level, P2;
   instructions for receiving an average amplitude measurement value in the laser controller, the average amplitude measurement value being produced by an average amplitude measurement device in response to the average amplitude measurement device receiving and processing the OMA detection signal produced by the single high-speed amplitude detector to obtain the average amplitude measurement value;
   instructions for performing a modulation current adjustment algorithm that processes the OMA measurement value and produces a modulation current control signal that is output to the laser driver, and wherein the laser driver receives the modulation current control signal and sets an amplitude of the electrical modulation current signal based on the received modulation current control signal; and
   instructions for performing a bias current adjustment algorithm in the laser controller, the bias current adjustment algorithm processing the average amplitude measurement value and producing a bias current control signal that is output to the laser driver, and wherein the laser driver receives the bias current control signal and sets an amplitude of the electrical bias current signal based on the received bias current control signal.

12. The computer program of claim 11, wherein the instructions for processing the OMA measurement value in the laser controller include instructions that compare the OMA measurement value to a threshold value to determine whether the compared value is less than the threshold value, wherein if a determination is made that the compared value is less than the threshold value, the modulation current control signal produced by the controller and output to the laser driver causes the laser driver to increase the amplitude of the electrical modulation current signal.

13. The computer program of claim 12, wherein the instructions for processing the OMA measurement value in the laser controller include instructions that compare the OMA measurement value to a threshold value to determine whether the compared value is greater than the threshold value, wherein if a determination is made that the compared value is greater than the threshold value, the modulation current control signal produced by the controller and output to the laser driver causes the laser driver to decrease the amplitude of the electrical modulation current signal.

14. The computer program of claim 11, wherein the instructions for processing the average amplitude measurement value include instructions that compare the average amplitude measurement value to a threshold value to determine whether the compared value is less than the threshold value, wherein if a determination is made that the compared value is less than the threshold value, the bias current control signal produced by the controller and output to the laser driver causes the laser driver to increase the amplitude of the electrical bias current signal.

15. The computer program of claim 14, wherein the instructions for processing the average amplitude measurement value include instructions that compare the average amplitude measurement value to a threshold value to determine whether the compared value is greater than the threshold value, wherein if a determination is made that the compared value is greater than the threshold value, the bias current control signal produced by the controller and output to the laser driver causes the laser driver to decrease the amplitude of the electrical bias current signal.

* * * * *